(12) United States Patent
Wang et al.

(10) Patent No.: US 11,749,741 B2
(45) Date of Patent: Sep. 5, 2023

(54) METHOD FOR FORMING SEMICONDUCTOR STRUCTURE

(71) Applicant: UNITED MICROELECTRONICS CORP., Hsin-Chu (TW)

(72) Inventors: Zhe Wang, Singapore (SG); Lu Zou, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 196 days.

(21) Appl. No.: 17/489,813

(22) Filed: Sep. 30, 2021

(65) Prior Publication Data

US 2023/0070135 A1 Mar. 9, 2023

(30) Foreign Application Priority Data

Sep. 8, 2021 (CN) .......................... 202111048449.1

(51) Int. Cl.
*H01L 21/324* (2006.01)
*H01L 29/66* (2006.01)
*H01L 29/78* (2006.01)
*H01L 21/02* (2006.01)

(52) U.S. Cl.
CPC .. *H01L 29/66492* (2013.01); *H01L 21/02334* (2013.01); *H01L 21/324* (2013.01); *H01L 29/6656* (2013.01); *H01L 29/66636* (2013.01); *H01L 29/7848* (2013.01)

(58) Field of Classification Search
None
See application file for complete search history.

(56) References Cited

U.S. PATENT DOCUMENTS

2023/0070135 A1* 3/2023 Wang .................. H01L 29/6656

* cited by examiner

*Primary Examiner* — Jack S Chen
(74) *Attorney, Agent, or Firm* — Winston Hsu

(57) ABSTRACT

The invention provides a method for forming a semiconductor structure. The method includes providing a substrate, forming a gate structure on the substrate, respectively forming an epitaxial layer on both sides of the gate structure, and performing a pre-amorphization doping step on the substrate. After the pre-amorphization doping step, a defect is generated in the epitaxial layer, an outer spacer is formed beside the gate structure, and a chemical cleaning step is performed to remove a part of the epitaxial layer, and the defect in the epitaxial layer is removed.

9 Claims, 4 Drawing Sheets

METHOD FOR FORMING SEMICONDUCTOR STRUCTURE

BACKGROUND OF THE INVENTION

1. Field of the Invention

The present invention generally relates to a semiconductor process including a doping step. In particular, the present invention relates to a method for repairing defects generated in semiconductor doping process to prevent dislocation of epitaxial materials.

2. Description of the Prior Art

Implanting procedures are usually employed in the conventional semiconductor processes to implant the needed dopant. Although the implantation of the dopant comes with the benefits of adjustment of the electrical properties of the semiconductor elements, the damages on the materials coming with the implantation of the dopant usually make the elements more susceptible to unintended effects. In order to solve the dilemma, this technical field thus develops a precise damage engineering. This enhancing amorphization technique enhances the amorphization by implantation to later reduce the residual damage post-anneal. A conventional approach is called a pre-amorphization implant, PAI for short, to form a specific amorphous region on a target material.

However, the pre-amorphization implant method still has some drawbacks. For example, although the pre-amorphization implant method is able to form a specific amorphous region on a target material, the lattice of the target material is also likely to suffer collateral damages, to form dislocations for instance. Dislocation flaws may result in the low junction leakage. Further, in a later rapid thermal step it is possible to encounter the relaxation of the stress in the epitaxial material.

SUMMARY OF THE INVENTION

The invention provides a method for forming a semiconductor structure, which comprises providing a substrate, forming a gate structure on the substrate, respectively forming an epitaxial layer on both sides of the gate structure, and performing a pre-amorphization doping step on the substrate, wherein after the pre-amorphization doping step, a defect is generated in the epitaxial layer, an outer spacer is formed beside the gate structure, and a chemical cleaning step is performed to remove a part of the epitaxial layer.

Therefore, the present invention proposes a novel semiconductor process. The novel semiconductor manufacturing process of the present invention includes a method for repairing defects generated in the doping step. Although the doping step is still carried out in the novel semiconductor manufacturing process of the present invention, it can prevent the defect that the epitaxial stress material generates dislocation after the doping step, and prevent the occurrence of problems such as dislocation, junction leakage current and stress relief in the epitaxial material, so as to obtain better reliability and device speed of the obtained semiconductor device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIGS. 1 to 7 illustrate a method of fabricating a semiconductor structure according to an embodiment of the present invention. The main feature of the present invention is to provide a method for repairing defects generated in the pre-amorphization doping step.

Figure 1:
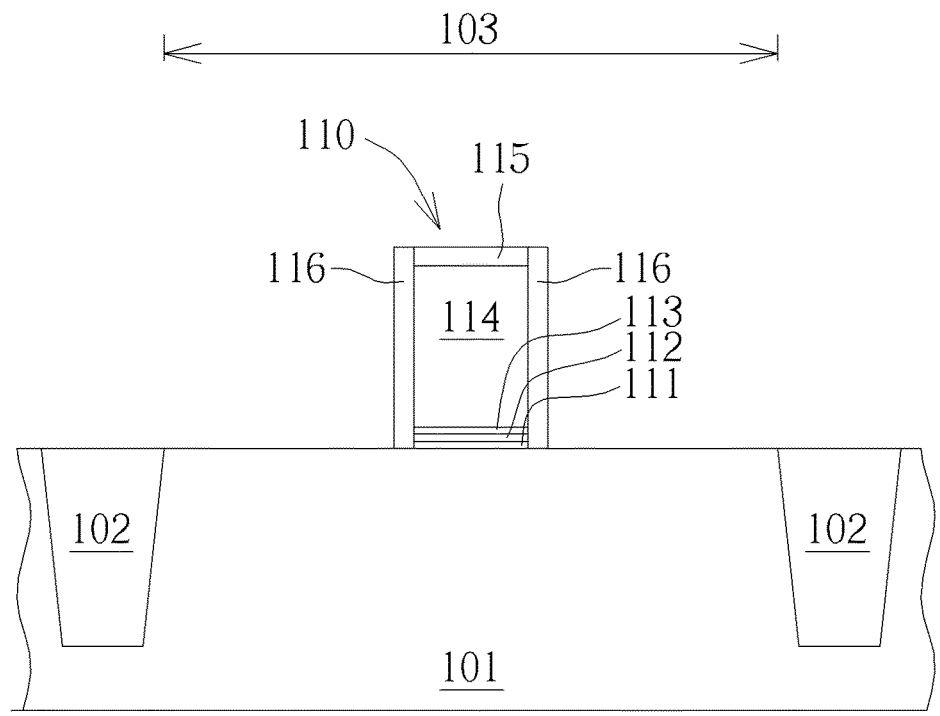
FIGS. 1 to 7 illustrate a method of fabricating a semiconductor structure according to an embodiment of the present invention.

First, as shown in FIG. 1, a substrate 101 is provided. The substrate 101 may be a semiconductor substrate, such as silicon. In addition, in the substrate 101, a plurality of shallow trench isolations 102 for electrical isolation are formed in advance. For the step of forming the shallow trench isolation 102, the following method can be referred. First, a hard mask (not shown) is used to etch a plurality of trenches (not shown) for forming shallow trench isolation in the substrate 101. The region 103 of the substrate 101 can be used as PMOS or NMOS. Then, an insulating material (not shown) is filled into the previously formed trench (not shown), and the hard mask (not shown) and redundant insulating material (not shown) are removed during a planarization step to obtain the shallow trench isolation 102.

In addition, a gate structure 110 may be additionally formed on the substrate 101. Furthermore, the bottom of the gate structure 110 may be a composite structure. For example, the composite structure includes a gate dielectric layer 111, an optional high dielectric constant (high-k) layer 112 and a barrier layer 113. In the gate structure 110, there is a gate material layer 114, which is covered by a hard mask 115. The gate dielectric layer 111 is in direct contact with the substrate 101 and serves as an electrical insulation between the gate structure 110 and the substrate 101. If the gate structure 110 is a silicon gate, the gate dielectric layer 111 may comprise a compound of silicon, such as silicon oxide, silicon oxynitride, silicon nitride or a combination thereof. If the gate structure 110 is a metal gate, the gate dielectric layer 111 may comprise an oxide, such as silicon dioxide. Optionally, the high dielectric constant layer 112 may comprise a material with high dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate ($SrTiO_3$), zirconium silicon oxide ($ZrSiO_4$), hafnium zirconate oxide ($HfZrO_4$), strontium bismuth tantalate ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). The barrier layer 113 is used to isolate the gate material layer 114 from the bottom, and may contain metal compounds, such as titanium nitride.

Furthermore, the current gate material layer 114 may form a dummy gate and then be replaced by a metal material to form a metal gate (not shown). At this time, the gate material layer 114 can be an undoped polysilicon or doped polysilicon to form a silicon gate. The hard mask layer 115 may be a hard mask material containing silicon.

The gate structure 110 may also have an inner spacer 116 located inside and an outer spacer (not shown). In the inner spacer 116, for example, a thermal oxidation method is used to form silicon oxide on the sidewall of the gate structure 110, and multiple layers of materials such as the gate dielectric layer 111, the high dielectric constant (high-k) layer 112, the barrier layer 113, the gate material layer 114 and the hard mask layer 115 can be repaired and etched at the same time. In addition, after the formation of the inner spacer 116, an implantation step of a lightly doped drain (LDD) (not shown) may also be generally performed.

Figure 2:
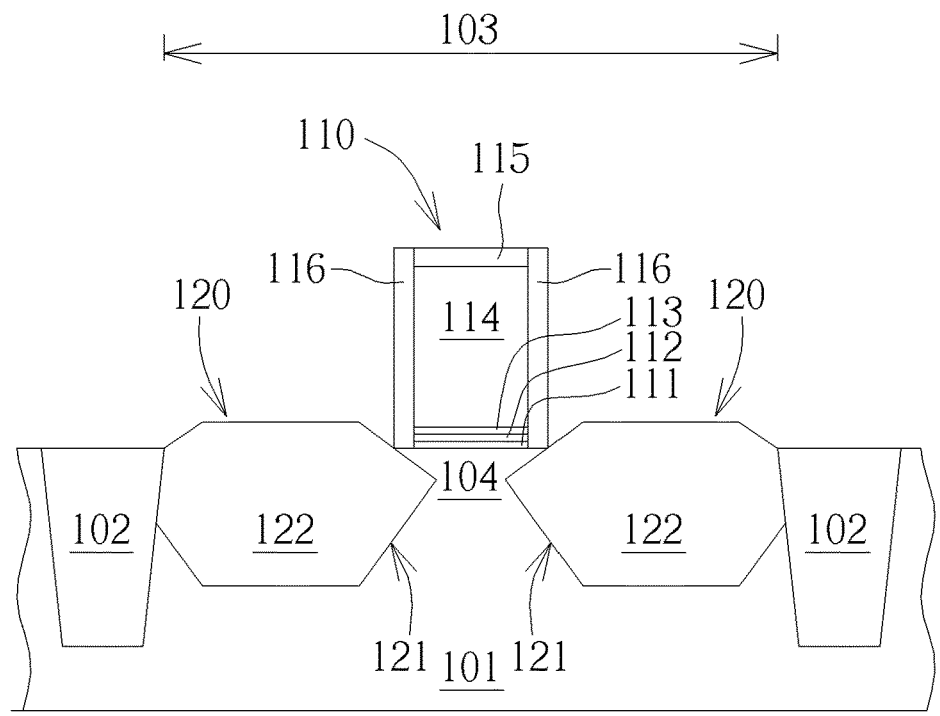

Then, as shown in FIG. 2, an embedded semiconductor epitaxial layer, that is, an embedded silicon germanium layer 120, is formed in the substrate 101. The substrate 101 includes at least one cavity 121, and an epitaxial layer (silicon germanium) 122 fills the cavity 121 to become an embedded silicon germanium layer 120. The method of forming the embedded silicon germanium layer 120 can refer to the following example. At first, the exposed substrate 101 is etched once or many times by the shielding of the inner spacer 116 and the hard mask layer 115 to form a cavity 121, which can have a special three-dimensional shape. For example, the cavity 121 extends laterally and partially occupies the gate channel 104 located below the gate structure 110. Optionally, the cavity 121 may be formed in the same step as etching to obtain the inner spacer 116. Then, after the cleaning process is completed, the epitaxial layer 122 can be used to fill the cavity 121 to obtain the embedded silicon germanium layer 120.

Figure 3:
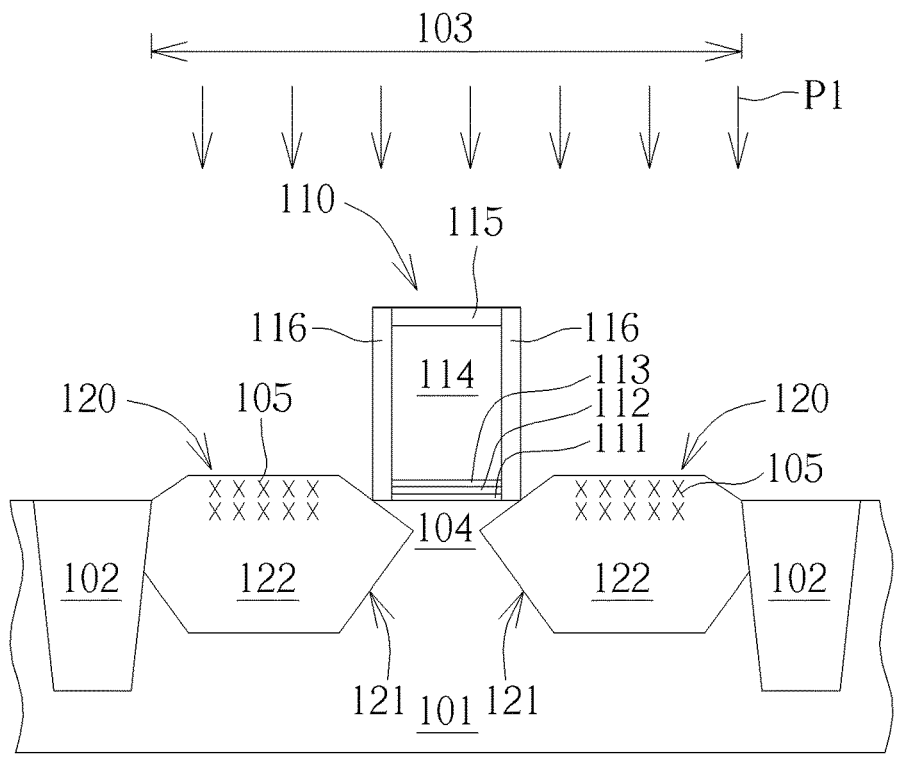

Then, as shown in FIG. 3, a pre-amorphization doping step P1 can be performed on the embedded silicon germanium layer 120 to form an amorphized region 105. In this embodiment, arsenic can be used for this pre-amorphization doping step. The pre-amorphization implantation (PAI) can be a straight or angled PAI process to form an amorphized region 105 in the embedded silicon germanium layer 120 on both sides of the gate structure 110. However, the applicant found that defects are easy to occur when arsenic is used in the doping step. In detail, the pre-amorphization doping step P1 will produce considerable interstitial defects due to the impact of dopants on the silicon lattice.

As mentioned above, in general, the pre-amorphization doping step P1 can destroy the epitaxial structure embedded in the silicon germanium layer 120, resulting in an amorphized region 105. One of the purposes of the present invention is to repair the amorphized regions 105. In this way, the defects of the current pre-amorphization doping step can be effectively avoided, for example, dislocation may occur along the amorphized region 105, so if the defects caused by the amorphized region 105 can be repaired, the generation of dislocation can be reduced. In a preferred embodiment of the present invention, pre-amorphization doping steps with different depths can be performed on the embedded silicon germanium layer 120, so that different regions in the embedded silicon germanium layer 120 can be selectively amorphized and doped. For example, in this embodiment, the amorphization regions 105 are mainly distributed in the top region of the epitaxial layer 122.

Figure 4:
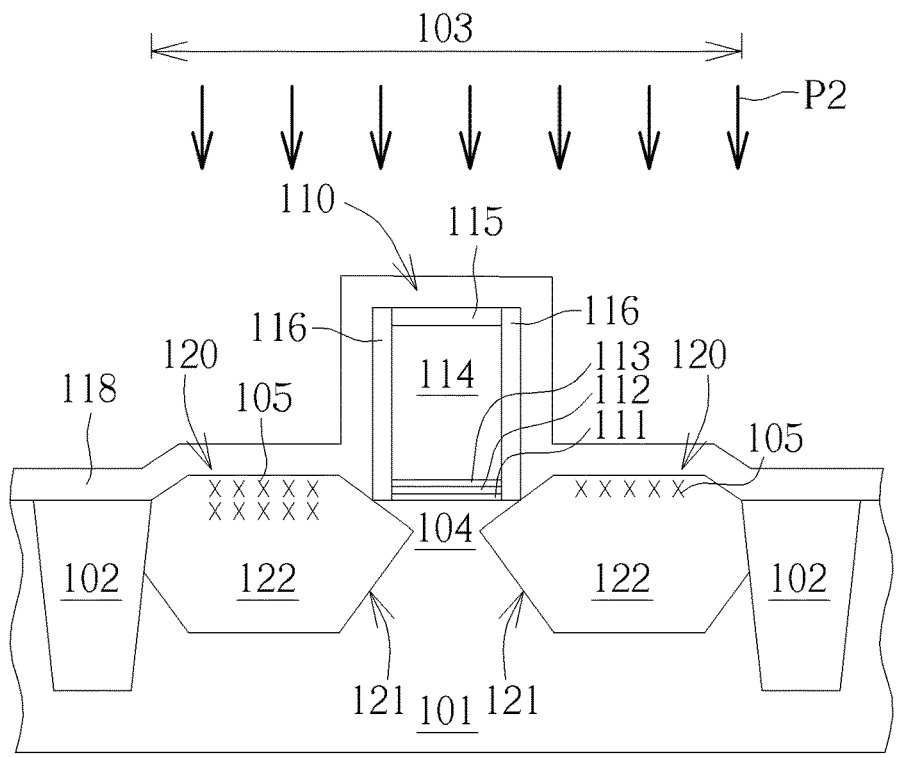

In the next step, as shown in FIG. 4, a dielectric layer 118, such as silicon oxide, is uniformly covered outside the inner spacer 116. In this embodiment, the deposition thickness of the dielectric layer 118 is about 740 angstroms or more, but is not limited to this. It is worth noting that, after covering the dielectric layer 118, a low-temperature heating process P2 is additionally performed. The temperature of the low-temperature heating step P2 is about 500 degrees Celsius to 600 degrees Celsius, and the time is about 10 minutes. The purpose of the low-temperature heating process P2 here is to repair the defects of the amorphous region 105. According to the applicant's experiment, heating at low temperature (about 500 degrees Celsius to 600 degrees Celsius) for a long time is helpful to repair the amorphized region 105, especially the area near the lower half of the amorphized region 105. Because the lower half portion is less amorphous, the repair effect is more obvious. In FIG. 4, it is shown that the depth of the amorphized region 105 becomes shallower, which indicates that the amorphized region 105 is partially repaired.

Figure 5:
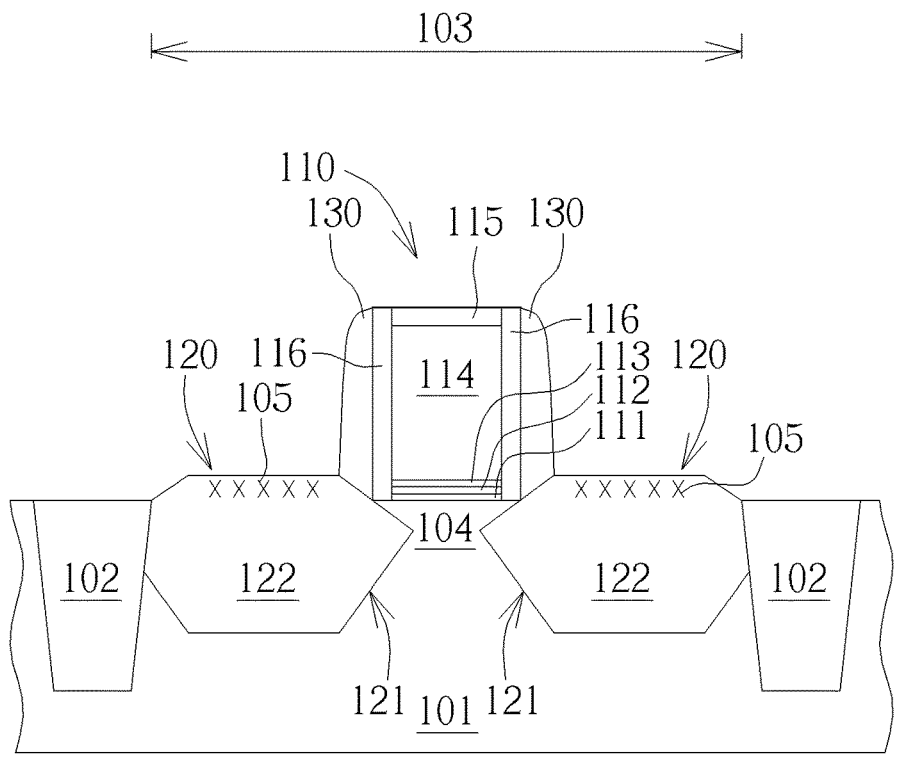

Then, as shown in FIG. 5, an etching step is performed to remove part of the dielectric layer 118, and the remaining material layer becomes the outer spacer 130. The outer spacer 130 may be a single layer or a composite layer, and the present invention is not limited thereto.

Figure 6:
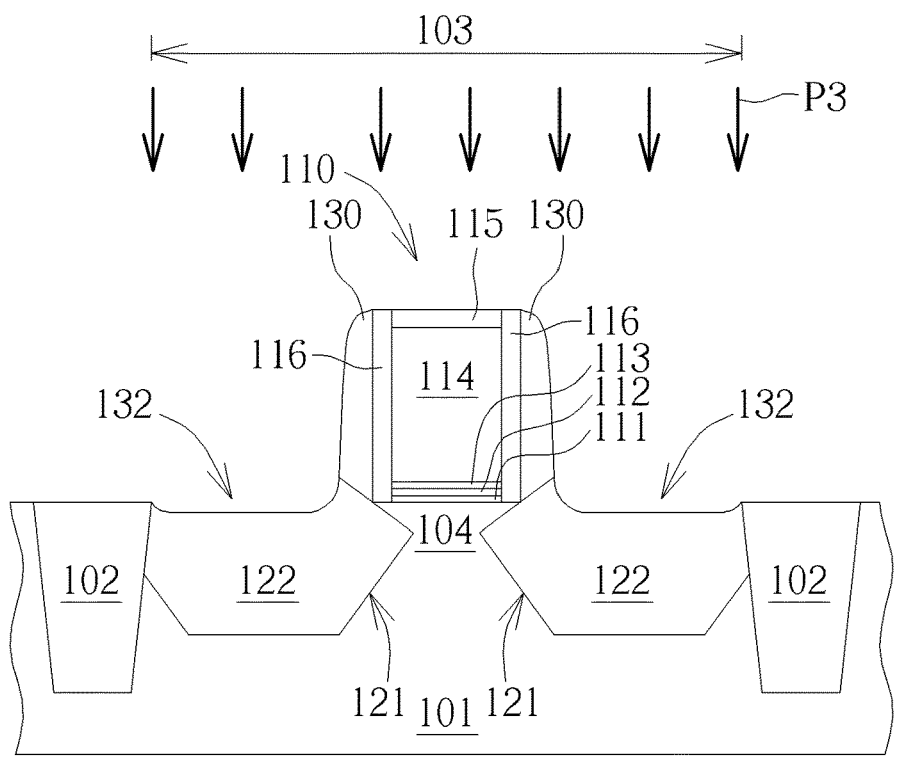

Then, as shown in FIG. 6, after the outer spacers 130 are formed, the source/drain regions are scheduled to be formed in the epitaxial layer 122. However, in some embodiments, the above-mentioned low-temperature heating process P2 cannot completely repair the defects of the amorphous region 105. According to the applicant's experiment, even if the heating time is prolonged or the heating temperature is increased, the repair effect on the amorphous region 105 is still limited. According to the results, although the depth of the amorphized region 105 becomes shallow, a part of the amorphized region 105 may still remain in the surface area of the epitaxial layer 122. In the subsequent step, if the epitaxial layer 122 is directly ion-doped to form the source/drain, the amorphized region 105 here may cause adverse effects (for example, increase the occurrence probability of the dislocation). Therefore, in this embodiment, before forming the source/drain region, a cleaning step P3 is additionally performed. The cleaning step P3 here is, for example, a standard cleaning step SC-1 (or APM cleaning), in which the mixed solution containing ammonia water, hydrogen peroxide and pure water is cleaned at about 70 degrees Celsius, while the cleaning time in this embodiment is about 120 seconds. According to the experimental results of the applicant, the cleaning step P3 here can not only remove impurities on the wafer surface, but also remove a part of the surface of the epitaxial layer 122, resulting in a concave top surface 132 on the surface of the epitaxial layer 122. The remaining amorphized region 105 will also be removed while forming the concave top surface 132.

Figure 7:
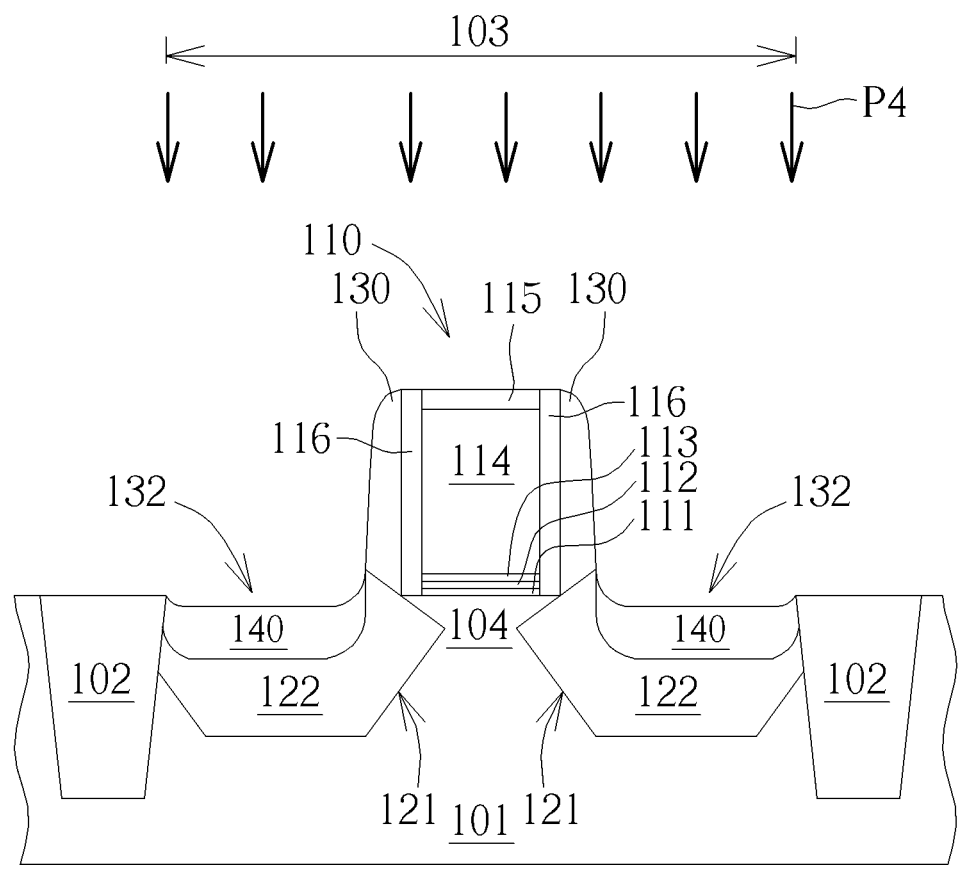

Then, as shown in FIG. 7, a source/drain doping step and an annealing step (represented by step P4 in FIG. 7) are performed to form a source/drain region 140 in the top region of the epitaxial layer 122. The source/drain doping step can dope different ions according to the type of transistor (N-type or P-type), and the annealing step can be a conventional source/drain annealing step, which is used to activate previously implanted dopants. Then, other necessary semiconductor steps can be performed, such as replacing the gate material layer 114 with an appropriate metal material to form a metal gate, forming a silicide layer, forming contact holes, forming contact plugs, and so on. These subsequent necessary processes are well known to the skilled person, so it is not necessary to repeat them in detail.

According to the above description and drawings, the present invention provides a method for forming a semiconductor structure, which comprises providing a substrate 101, forming a gate structure 110 on the substrate 101, respectively forming an epitaxial layer 122 on both sides of the gate structure 110, and performing a pre-amorphization doping step P1 on the substrate 101, wherein a defect (amorphized region) 105 is generated in the epitaxial layer 122 after the pre-amorphization doping step P1. An outer spacer 130 is formed beside the gate structure 110, and a chemical cleaning step P3 is performed to remove a part of the epitaxial layer 122 and remove the defect 105 in the epitaxial layer 122.

In some embodiments of the present invention, the defect 105 is located in a top region of the epitaxial layer 122.

In some embodiments of the present invention, the method of forming the outer spacer 130 includes covering a dielectric layer 118 on the gate structure 110 and the epitaxial layer 122, performing a low-temperature heating step P2 on the dielectric layer, and performing an etching step to remove part of the dielectric layer 118, wherein the remaining dielectric layer is defined as the outer spacer 130 after the etching step.

In some embodiments of the present invention, the temperature of the low-temperature heating step P2 ranges from 500 degrees Celsius to 600 degrees Celsius.

In some embodiments of the present invention, during the low-temperature heating step P2, the defects 105 in the epitaxial layer 122 are partially repaired.

In some embodiments of the present invention, the thickness of the dielectric layer 118 is above 740 angstroms.

In some embodiments of the present invention, the pre-amorphization doping step P1 includes doping arsenic ions.

In some embodiments of the present invention, further include forming an inner spacer 116 before forming the outer spacer 130, wherein the inner spacer 116 is located between one side wall of the gate structure 110 and the outer spacer.

In some embodiments of the present invention, the chemical cleaning step P3 includes a standard cleaning step SC-1 (APM cleaning).

In summary, the present invention proposes a novel semiconductor process. The novel semiconductor manufacturing process of the present invention includes a method for repairing defects generated in the doping step. Although the doping step is still carried out in the novel semiconductor manufacturing process of the present invention, it can prevent the defect that the epitaxial stress material generates dislocation after the doping step, and prevent the occurrence of problems such as dislocation, junction leakage current and stress relief in the epitaxial material, so as to obtain better reliability and device speed of the obtained semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor structure, comprising:
    providing a substrate;
    forming a gate structure on the substrate, and forming an epitaxial layer in the substrate on both sides of the gate structure respectively;
    performing a pre-amorphization doping step on the substrate, wherein after the pre-amorphization doping step, a defect is generated in the epitaxial layer;
    forming an outer spacer next to the gate structure; and
    performing a chemical cleaning step to remove a part of the epitaxial layer and remove the defects in the epitaxial layer.

2. The method according to claim 1, wherein the defect is located in a top region of the epitaxial layer.

3. The method according to claim 1, wherein the method of forming the outer spacer comprises:
    forming a dielectric layer covering on the gate structure and the epitaxial layer;
    performing a low-temperature heating step on the dielectric layer; and
    performing an etching step to remove part of the dielectric layer, wherein after the etching step, the remaining dielectric layer is defined as the outer spacer.

4. The method according to claim 3, wherein the temperature of the low-temperature heating step is between 500 degrees Celsius and 600 degrees Celsius.

5. The method according to claim 4, wherein the defect in the epitaxial layer is partially repaired during the low-temperature heating step.

6. The method according to claim 1, wherein the thickness of the dielectric layer is above 740 angstroms.

7. The method according to claim 1, wherein the pre-amorphization doping step comprises doping arsenic ions.

8. The method of claim 1, further comprising forming an inner spacer before forming the outer spacer, wherein the inner spacer is located between a sidewall of the gate structure and the outer spacer.

9. The method according to claim 1, wherein the chemical cleaning step comprises a standard cleaning step (SC-1 cleaning).

* * * * *